United States Patent

Wienand et al.

[11] Patent Number: 6,159,386
[45] Date of Patent: Dec. 12, 2000

[54] ELECTRICAL RESISTANCE WITH AT LEAST TWO CONTACT FIELDS ON A CERAMIC SUBSTRATE AND PROCESS FOR MANUFACTURING THE SAME

[75] Inventors: Karlheinz Wienand, Aschaffenburg; Karlheinz Ullrich, Gross-Umstadt; Margit Sander, Karlstein; Stefan Dietmann, Haiterbach, all of Germany

[73] Assignee: Heraeus Electro-Nite International N.V., Houthalen, Belgium

[21] Appl. No.: 09/329,561

[22] Filed: Jun. 10, 1999

Related U.S. Application Data

[63] Continuation of application No. PCT/EP97/06757, Dec. 3, 1997.

[30] Foreign Application Priority Data

Dec. 10, 1996 [DE] Germany .......................... 196 51 141

[51] Int. Cl.⁷ .................................................. H01C 1/014
[52] U.S. Cl. .............................. 216/16; 216/39; 374/185; 438/55
[58] Field of Search ................................. 216/13, 16, 19, 216/38, 39, 76, 101; 361/179, 185; 428/913; 73/25.03, 204.11; 374/185, 208

[56] References Cited

U.S. PATENT DOCUMENTS

| | | | |
|---|---|---|---|
| 4,895,616 | 1/1990 | Higashi et al. | 156/647 |
| 4,906,965 | 3/1990 | Murata et al. | 338/25 |
| 5,466,331 | 11/1995 | Belcher | 216/17 |
| 5,466,332 | 11/1995 | Owen et al. | 156/630 |
| 5,493,177 | 2/1996 | Muller et al. | 313/578 |
| 5,542,558 | 8/1996 | Benz et al. | 216/2 |
| 5,788,854 | 8/1998 | Desaigoudar et al. | 216/13 |

FOREIGN PATENT DOCUMENTS

| | | |
|---|---|---|
| 0 446 667 A2 | 9/1991 | European Pat. Off. . |
| 2 302 615 | 8/1974 | Germany . |
| 34 30 075 A1 | 2/1986 | Germany . |
| 38 29 765 A1 | 3/1989 | Germany . |
| 30 15 356 C2 | 4/1989 | Germany . |
| 38 29 195 A1 | 3/1990 | Germany . |
| 39 27 735 A1 | 2/1991 | Germany . |

*Primary Examiner*—Randy Gulakowski
*Assistant Examiner*—Allan Olsen
*Attorney, Agent, or Firm*—Akin, Gump, Strauss, Hauer & Feld, L.L.P.

[57] ABSTRACT

A temperature-dependent measuring resistance with rapid response time is at least partially arranged on an electrically insulating surface of a ceramic substrate, wherein a portion of the conductor path spans a recess situated in the substrate in a bridge-like manner, and the remaining portion of the conductor path in the edge area of the substrate adjacent to the recess is provided with connection contact fields. The conductor path comprises a platinum or gold layer, wherein the conductor path is partially provided with a cover layer of glass, and wherein the connection contact fields are exposed. In a further embodiment, the conductor path is arranged together with the connection contact fields either on a screen-printed glass membrane or on a thin film membrane applied in a PVD process, which covers the surface of the ceramic substrate and spans the recess. The cover layer is likewise selectively applied by screen printing in case there is a glass membrane. In the case of a thin film membrane, the cover layer is also applied selectively by a PVD process and can be the same material as the thin film membrane. The ceramic substrate preferably comprises aluminum oxide.

11 Claims, 6 Drawing Sheets

ELECTRICAL RESISTANCE WITH AT LEAST TWO CONTACT FIELDS ON A CERAMIC SUBSTRATE AND PROCESS FOR MANUFACTURING THE SAME

CROSS REFERENCE TO RELATED APPLICATION

This application is a continuation of International Application PCT/EP97/06757, filed Dec. 3, 1997, the disclosure of which is incorporated herein by reference.

BACKGROUND OF THE INVENTION

The invention concerns an electrical resistor, especially a temperature-dependent measuring resistance with rapid response time, having a conductor path (printed circuit) provided with at least two connection contact fields, which are arranged on an electrically insulating surface of a substrate, wherein a portion of the conductor path spans at least one recess of the substrate in a bridge-like manner, and the conductor path is arranged in a plane. The invention also relates to a process for manufacturing the electrical resistor.

A temperature measuring arrangement (radiation thermometer) is known from German published patent application DE 39 27 735 A1 with a temperature-sensitive thin film resistance, which is applied meander-shaped to a plastic sheet which is stretched over a cavity of a substrate material. A circuit board or a carrier of epoxide resin is provided as a substrate. Such a temperature measuring arrangement is only suited for use in an environment with temperatures below 200° C., owing to the low thermal stability of synthetic resin.

Furthermore, from German published patent application DE-OS 23 02 615, a temperature-dependent electrical resistor of resistance material is known, which forms a winding conductor path as a thin layer, which is applied over a thin foil. The foil made of polymer plastic spans with its uncoated side a recess in a carrier element which, for example, consists of copper, wherein the recess has the same shape as the conductor path and aligns with it in a direction perpendicular to the foil plane. Here, it is a matter of a temperature measuring arrangement which requires a high technical expenditure for the requisite precise overlaying of conductor path and recess.

It is known from German patent DE 30 15 356 C2 that electric circuits in thick layer technology are preferably manufactured on ceramic, plate-shaped substrates by imprinting pastes whose active material consists of metal powders, glass or glass ceramic powders, or mixtures of glass and metal oxides. For manufacturing rapidly responding sensors for temperature measurement, temperature-sensitive thick layer resistors are applied to self-supporting layers, which are obtained by paste screen-printing with the aid of a filler gasifiable under the action of temperature and cover a subsequently formed hollow space. Here, it is a question of a relatively expensive process.

Furthermore, from German published patent application DE 38 29 765 A1 or U.S. Pat. No. 4,906,965, a platinum temperature sensor is known, in which a platinum resistance path with at least two ends is mounted on a surface of at least one ceramic substrate. For manufacturing it, a platinum conductor path in the form of a meander-zigzag pattern is applied to the inner surface of a ceramic sheet and subsequently shaped into a roll, wherein breaks with adjusting bridges are provided between adjacent points of the conductor path pattern for the purpose of adjustment. The ceramic substrate is fired together with the applied platinum resistance. The platinum resistance is resistant toward the ambient atmosphere and moisture owing to sealing measures. In addition, after adjustment, the lead-in openings and conductors necessary for this are sealed off by means of a ceramic coating or glass paste. The comparatively high heat capacity turns out to be problematic with such an arrangement, which does not make possible a rapid response with sudden temperature changes, without further measures, and which reproduces an exact measured value only after execution of a transition function.

A further embodiment of a resistance element as rapid temperature sensor is known from German published patent application DE 38 29 195 A1. Here, the resistance element is constructed as a layer resistor of platinum paste, which is accommodated in a bubble made of glass ceramic, which is arched on an electrically insulating ceramic substrate. Here, the self-supporting arched resistor layer is to be regarded as problematic with respect to mechanical stresses, for example, shock, pressure or vibration during use in harsh environments.

SUMMARY OF THE INVENTION

An object of the invention is to provide resistors insensitive toward outer mechanical stresses for rapid-responding temperature sensors, which are especially suited as sensors for rapidly changing temperatures in gas masses in the temperature range of −100 to +800° C. Furthermore, with temperature sensors of this type, rapid gas mass measurers with microstructures are constructed, whose reaction time lies in the millisecond range.

This objective is accomplished in accordance with an arrangement whose substrate is formed from ceramics or glass and whose conductor path is fastened in the edge area of the substrate adjacent to the recess on the electrically insulating surface of the substrate. The high longevity of the sensor proves to be especially advantageous.

In a preferred embodiment, the conductor path is constructed in the shape of a meander (at least in the area of the recess), wherein the respective return areas of the meander are fastened in the edge area of the recess on the electrically insulating surface of the substrate, while the intermediate stretches of the meander span the recess in a bridge-like manner. The conductor path, in a preferred embodiment, is made of a platinum layer/Pt foil, which has a thickness in a range of 1 to 6 $\mu$m, preferably 2.5 $\mu$m.

It proves to be especially advantageous herein that, owing to the mass-poor structure, the sensor signal follows the rapidly changing measurement parameters almost inertia-free.

In a further preferred configuration of the resistor arrangement of the invention, the conductor path comprises a gold layer, wherein the gold layer has a thickness in the 1 $\mu$m to 8 $\mu$m range, preferably 2 $\mu$m to 3 $\mu$m. The manufacture of a structured gold layer proves to be advantageous, since galvanic deposition processes are state of the art, even for fine structures according to various processes.

In a further advantageous embodiment of the resistance arrangement, the electrical conductor path is installed on a plate-shaped membrane at least partially covering over the recess, wherein the membrane has a thickness in the 1 $\mu$m to 50 $\mu$m range. Here, the increased stability of the conductor path proves to be advantageous, as can be required especially in cases of severe mechanical stress, for example vibration.

The membrane comprises either a glass layer, which has a thickness of 10 $\mu$m to 50 $\mu$m, or it preferably is made of an SiO or TiO$_2$ layer, applied in a thin layer process, wherein it has a thickness of 1 μm to 10 μm, preferably a thickness of 2 μm. Owing to the comparatively thin membrane, advantageously a low thermal inertia and consequently a rapid responsiveness are guaranteed.

In a further advantageous embodiment, the conductor path on the substrate is provided with a cover layer of an electrically insulating material, which has a thickness in the 1 μm to 50 μm range. The conductor path is thereby protected, particularly in an aggressive environment, so that long-term stability increases. The cover layer of the conductor path comprises either glass with a thickness of the glass cover layer in a range of 10 μm to 50 μm, or a layer applied by means of a thin film process, wherein the cover layer advantageously comprises an SiO layer, which has a thickness of 1 μm to 10 μm, preferably a thickness of 2 μm. Owing to the comparatively thin cover layer, a rapid responsiveness as a temperature measuring resistance exists, wherein its outer surface is protected against interventions from the ambient atmosphere.

The above objective is accomplished according to a first process, in which a recess is created in a ceramic substrate, and this is filled by filler material of glass paste, glass ceramic, glass solder, silver, indium, nickel or a silver-nickel alloy, and the filling thus introduced is made level with the outer surface of the substrate. Subsequently, a conductor path of platinum or gold is applied to at least one portion of the electrically insulating constructed substrate surface; and the filler material is thereafter etched away, so that the metal conductor path spans the recess in a bridge-like manner in a plane. It proves to be especially advantageous herein to use indium as a filler material, since it can be very easily leveled off and can be chemically removed by means of a mixture of 45 g/l Ce(SO$_4$)$_2$, 160 g/l HNO$_3$, 80 g/l H$_2$SO$_4$, preferably at a temperature of 60° C.

The objective is accomplished in accordance with the invention according to a second process, wherein a recess is created in a ceramic substrate, and this is filled with filler materials of glass pastes, glass ceramics, glass solder, silver, indium, nickel or a silver-nickel alloy, and the filling thus introduced is made level with the outer surface of the substrate. A flat membrane is subsequently applied to the surface of the substrate by a screen printing or thin film process, and following this, a conductor path of platinum or gold is applied on the glass membrane galvanically or in a thin film process. Thereafter, a structured cover layer is at least partially applied to the conductor path, and finally, the filler material situated in the recess is etched away. Here also, the use of indium as a filler material is best suited.

In a preferred embodiment of the process, the membrane is applied to the surface of the substrate in a screen printing process as a glass membrane or in a thin film process as a thin film membrane of SiO. Consequently, the usual coating techniques can be used advantageously. In addition, the structured cover layer is applied to the conductor path in a screen printing process as glass or in a thin film process as a thin film layer of SiO.

In a preferred embodiment of the process, the recess is created by sawing at a depth range of 20% to 60% of the thickness of the substrate. It is, however, also possible to cut out the recess by a laser beam, so that it includes the entire substrate thickness. Such a process is advantageously used for a mass production of resistors with low manufacturing tolerance, since the later following chemical etching intervention for removing the filler material can take place very carefully (from the backside).

Preferably, glass pastes with approximately the same expansion coefficients as the substrate are applied as a cover layer on the conductor path and substrate and fired at a temperature in the 500° C. to 1000° C. range, especially 850° C. to 920° C. in a continuous heating furnace for a period of time of about 20 minutes. The comparatively simple mass production hereby proves to be advantageous.

Furthermore, the conductor path is preferably applied in a thin film process and structured by means of photolithography, ion etching and removal of photoresist. It moreover proves to be advantageous herein that a high precision of the resistance can be attained.

It is, however, also possible to deposit the conductor path galvanically in a resist channel on a previously applied metal electrode, and finally to remove the metal electrode chemically or by a dry etching process. It moreover proves to be advantageous that this process can run at low temperatures, so that the formation of cracks between the levelled-off filler material and the substrate is prevented. Alternatively, the conductor paths can be filled by a PVD process with Pt and subsequently separated by a lift-off technique.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiment(s) which are presently preferred. It should be understood, however, that the invention is not limited to the precise arrangements and instrumentalities shown. In the drawings.

DETAILED DESCRIPTION OF THE INVENTION

Figure 1:
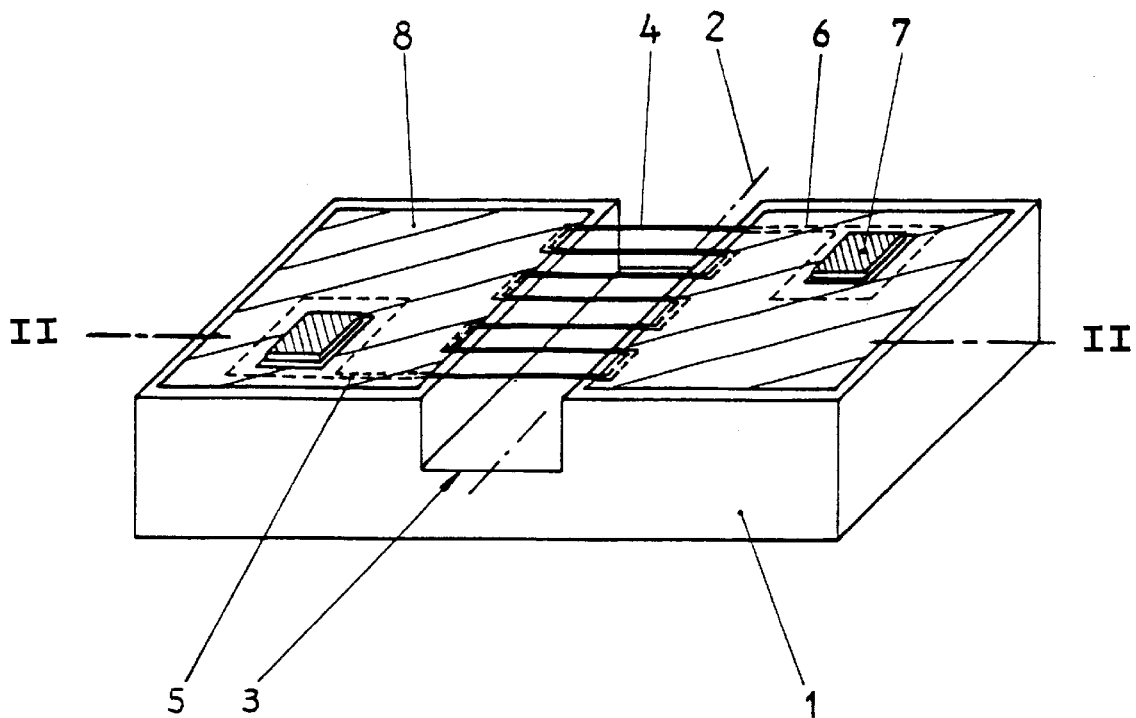
FIG. 1 shows in a perspective representation a first preferred embodiment of an electrical measuring resistor of the invention.
Figure 2:
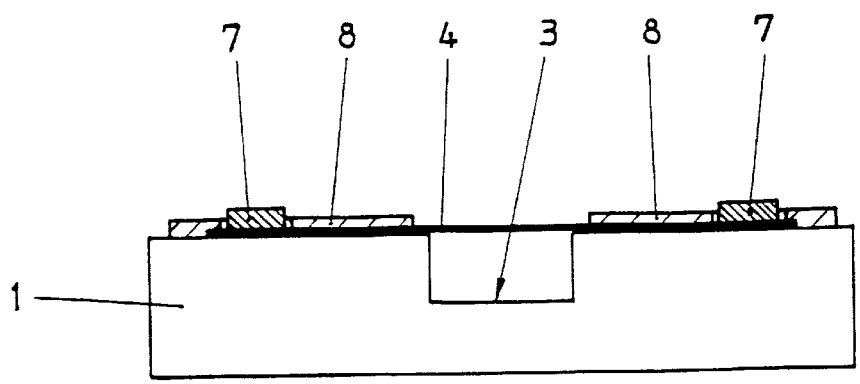
FIG. 2 shows a cross section through the longitudinal axis along line II—II in accordance with FIG. 1.

In accordance with FIGS. 1 and 2, the ceramic substrate 1 comprises a board-shaped block with an electrically insulating surface on the basis of ceramics or glass. The substrate 1 is provided with a recess 3 along its central axis 2, which is spanned in a bridge-like manner by a conductor path 4 serving as a measuring resistance, wherein portions of the conductor path 4 are fastened on the substrate in the edge area of the substrate toward the recess. The conductor path is provided on its respective ends 5 and 6 with connection contact fields 7, which serve for connection with an electrical evaluation circuit. Since the conductor path with its thickness of about 2.5 µm has an extremely small heat capacity, it can pick up extraordinarily rapidly the temperature of the surrounding atmosphere in the area bridging the recess 3, or of the gas atmosphere flowing through the recess 3, and consequently provide advantageously for a rapid evaluation or indication of thermal changes.

Furthermore, it is advantageously possible to record the gases selectively by application of a catalytic material on a conductor path constructed as a platinum foil.

Substrate 1 here comprises an aluminum oxide ceramic with 99.6 wt % $Al_2O_3$ and has a thickness in the 0.1 to 1.0 mm range. Preferably, the thickness of the substrate lies in the 0.6 to 0.7 mm range. The width of the recess 3 preferably lies in the 0.5 to 1 mm range, the depth of the same in the 0.1 to 0.4 mm range. The conductor path 4 comprises a platinum layer with a thickness of about 2.5 µm, wherein a glass cover layer 8 is applied by a screen printing process to the platinum layer in the support area of the substrate 1, wherein the ends 5, 6 of the conductor path 4 are left free from the glass cover layer and are provided with a gold layer, likewise applied by a screen printing process, as connection contact fields 7.

For manufacture, in a ceramic substrate 1 of aluminum oxide, having a thickness of 0.6 to 0.7 mm, preferably 0.635 mm linear milled slots are created for recess 3 with a breadth of 0.78 mm to a depth of 0.3 mm. The milled slots are first partially filled, by metered injection with glass pastes of various types, to a milling depth of three fourths and dried for an hour at a temperature of 180° C. Subsequently, they are fired at a peak temperature of about 850° C. for 20 minutes in a continuous heating furnace with compressed air flowing through. Thereafter, a second filling of the milled slots takes place such that, after renewed drying and after renewed firing of the glass paste at the same parameters as with the first filling, an overfilling of about 0.1 to 0.2 mm of the milled slots in substrate 1 exists. This means that the filling projects about 0.1 to 0.2 mm above the outer surface of the substrate.

Thereafter, the still projecting fired glass paste is ground down in a wet process using silicon carbide grain sizes of 350, 500, 800, 1200, 2400 and 4000, so that the transitions in the ceramic substrate-glass paste area possess so little unevenness, that it lies in the range of less than 1 µm. Upon a microscopic observation, no crack between ceramic and glass is any longer recognizable, which could exert a negative effect on subsequent processes. The form-locking filling of the linearly introduced milled slots of recess 3 is, in the final analysis, to be attributed to the expansion coefficient of the glasses, which in the temperature range considered amount to about $7.5 \times 10^{-6}$ per degree Celsius, and consequently almost correspond to the expansion coefficient of the aluminum oxide ceramic which is used for substrate 1.

After a cleaning process, these thus-filled substrates are vapor deposited with a metered platinum coating to a thickness of 1.5 µm to 2.5 µm. Thereafter, according to the state of the art (for example, DE 36 03 785 C2 or DE 42 02 733 C2), occur well known operations such as photolithography, ion etching of the platinum, and removal of the photoresist by means of incineration.

It has emerged upon microscopic examination that the platinum conductor paths, with a width in the 10 µm to 15 µm range, in the transition area from ceramic to glass remain undamaged. Following structuring, the application of a suitable glass cover layer 8 (for example, IP 211 of W. C. Heraeus GmbH & Co. KG) as well as of the connection contact fields 7 with a gold surface takes place by screen printing. The measuring resistances arranged on the multi-unit ceramic substrate are then separated into individual parts by a frame saw. Finally, the areas filled with glass pastes are dissolved from the recesses 3 from the face sides in. This takes place by means of concentrated $HNO_3$ (65 percent) at a temperature of 50° C. A temperature sensor manufactured according to this process has, for example, the following data:

R0=6.64 Ohm;
R100=9.12 Ohm;
Tk=3733 ppm/K, wherein the platinum is still untempered;
$R_\square$=0.043 Ohm (square resistance);
[$R_\square$ is the quotient of the specific resistance ρ and layer thickness d (R=ρ/d).]
Conductor path width=50 µm;
Overall conductor path length: L=8.6 mm.

For determining the response time of the sensor, a measurement structure is used, in which a current generator switches on a current signal of 0.100 A within a time of 0.5 ms to the sensor, which is situated in an ambient atmosphere at a temperature of T=25° C. The heating of the sensor is held as a time-dependent voltage drop with a storage oscilloscope, from which the course of the temperature increase of the sensor can be determined over time. From the voltage $U_\infty$, the self-adjusting equilibrium temperature can be calculated.

A temperature sensor manufactured according to this process manifests a rapid voltage rise to 0.73 volts, and as a consequence of the heating, a further voltage rise to $U_\infty$=0.860 V is obtained, which corresponds to a resistance of $R_\infty$=8.60 Ohm and a temperature of $T_\infty$=78° C. The temperature jump of ΔT=53° C. was reached within 3.2 ms (t 50%).

As an alternative to the process just described, process steps relying on CIB (CIB=Chip in Board) technology can be used, or used in modified form, to produce a free meander structure of the conductor path. CIB technology is described, for example, in Nohr, W.-D. and Hanke, G., "Reverse Beam-Lead Interconnections for Ultra High-Speed Multichip Applications," 5th *International Conference & Exhibition on Multichip Modules*, Denver, USA (Apr. 17–19, 1996); and Hanke, G. and Nohr, W.-D., "A New Chip Interconnection Technique for Ultra High Speed and Millimeter Wave Applications," 1996 *IEEE MTTS International Microwave Symposium*, San Francisco, USA (June 1996).

Figure 3:
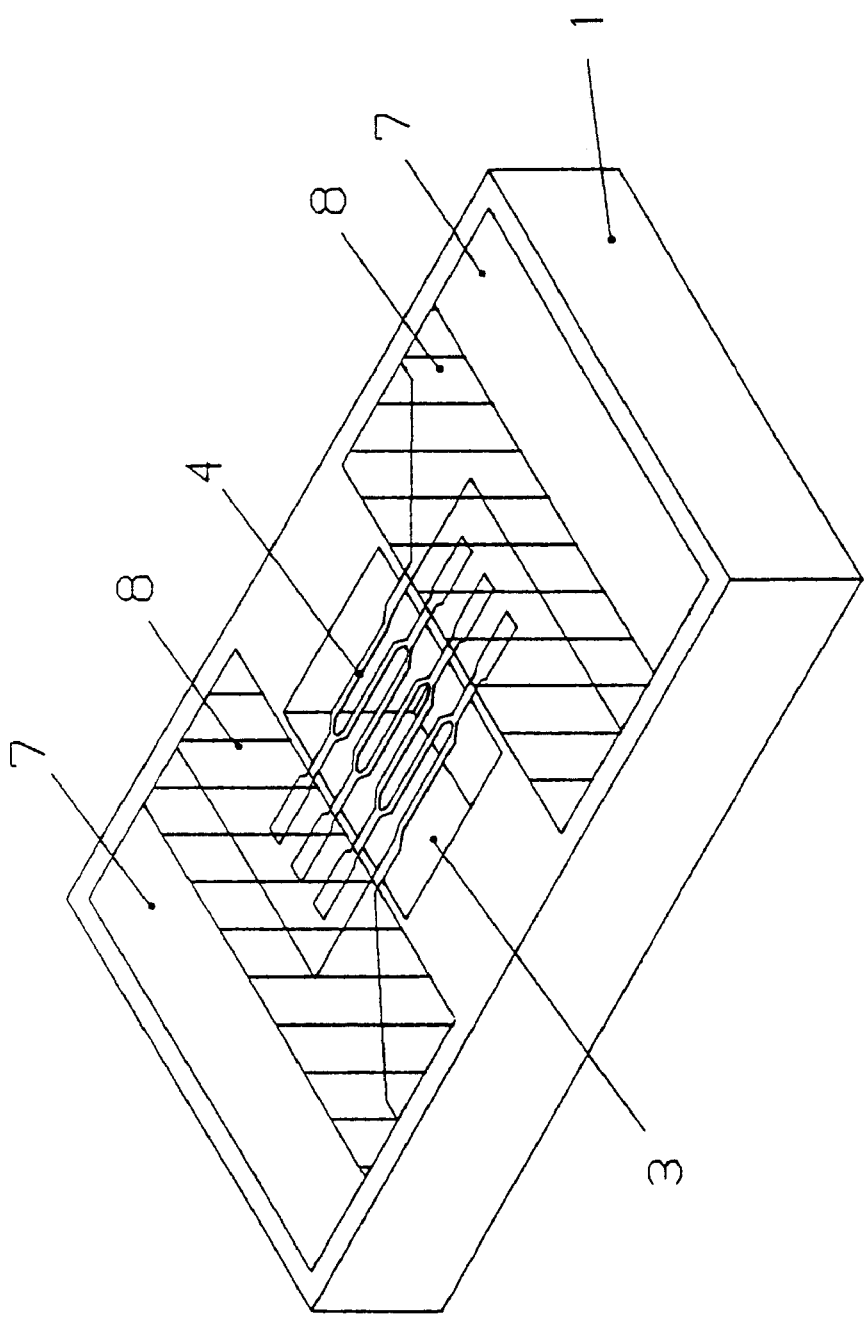
FIG. 3 shows a resistor manufactured according to an alternative process, in which the recess is created in the ceramic substrate by laser cutting.

Following laser cutting of substrate openings in accordance with FIG. 3, a Cr/Au thin film metalization is applied by a PVD process after a chemical edge cleaning. The substrate openings are then filled from the reverse side with indium. Thereafter follows a uniform photoresist coating (thickness, for example, 6 µm), and subsequently the exposure and development of the resist. The conductor paths thus exposed are now built up, for example by a galvanic fine gold electrolyte, to a thickness of, for example, 5 µm. After removing the resist, the base metalization is removed by an ion etching process or in a wet chemical process by differential etching. Finally, the introduced indium filling is once again dissolved out chemically.

These process steps were modified so as to obtain a component with a self-supporting platinum conductor path structure. The Cr/Au base metalization was thereby replaced by a platinum thin layer of 0.05 µm to 0.1 µm applied by means of a PVD process.

Following the photostructuring process, a 1.5 µm to 3 µm thick platinum conductor path structure was deposited galvanically in an acid platinum electrolyte. The platinum structures were separated by an ion etching. Finally, an additional tempering process of the platinum layer was conducted. The further application of the cover and contacting layers 7, 8 took place as described previously.

Figure 4:
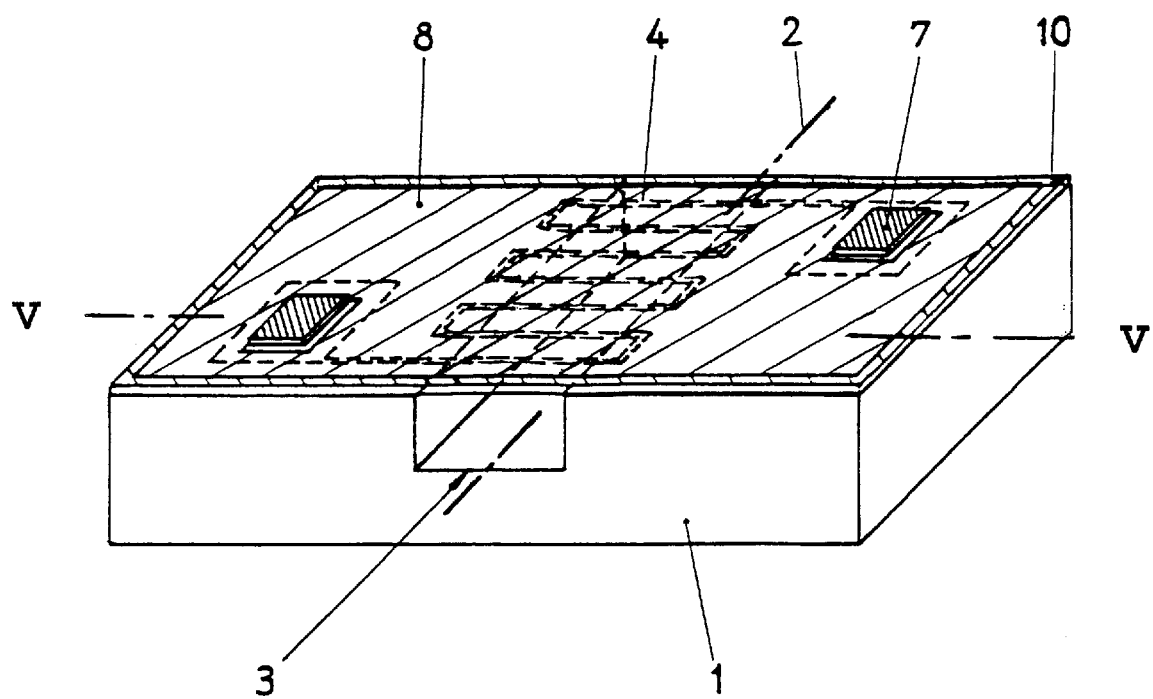
FIG. 4 shows in perspective representation a further preferred embodiment of the invention, in which the platinum structure of the measuring resistance is applied on a membrane, which is situated on the surface of the substrate.
Figure 5:
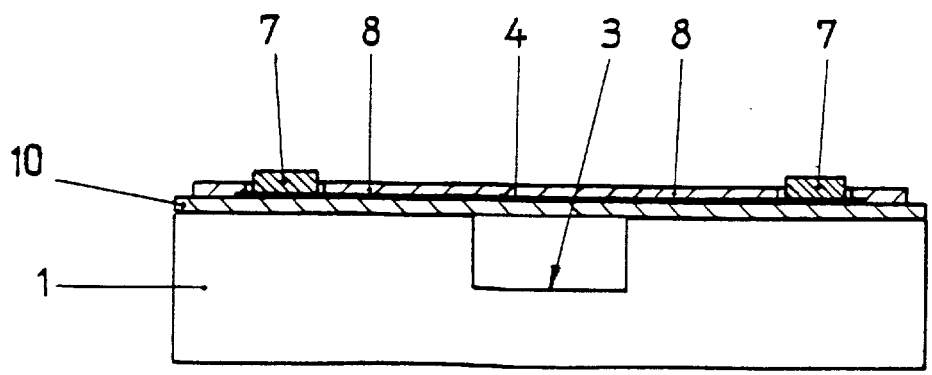
FIG. 5 shows a cross section through the longitudinal axis along the line V—V according to FIG. 4.

FIG. 4 shows an embodiment of the resistor in which the same substrate 1 with recess is used, as in the previously explained first embodiment according to FIGS. 1 and 2. In contrast thereto, the surface of the substrate 1 was covered by a flat plate-shaped membrane 10 of glass, which closes off the recess 3 toward the top. On this membrane 10, the conductor path 4 is then applied as a platinum coating, wherein similar to the manner explained for FIGS. 1 and 2, the ends 5 and 6 of the conductor path are connected respectively with connection contact fields 7, which are likewise applied to the membrane 10. The structure of the conductor path 4 is applied by a screen printing process, just as the glass cover layer 8. The overall thickness of the membrane 10 lies in a range of 10 µm to 50 µm. FIG. 5 shows a sectional representation perpendicular to axis 2 along line V—V of FIG. 4.

For manufacture, a silver profile wire with dimensions of 0.79 mm×0.28 mm is cut to substrate size and embedded almost level into the recess by means of a 900° C. melting point glass paste, for example Type IP 156 of W. C. Heraeus GmbH & Co. KG. Subsequently, a cover plate is fastened on the substrate using two clamps. After this, the glass paste is dried at a temperature T=120° C. for two hours and fired at a peak temperature of about 920° C. for a period of 20 minutes. Then, a second screen print of another glass plate takes place with subsequent drying and firing at a peak temperature of 850° C. for a period of twenty minutes. From this, there results the already previously mentioned overall glass thickness of the membrane 10 of 10 µm to 50 µm. After cleaning the glass surface, the process already described on the basis of FIGS. 1 and 2 is conducted up to the final separation of the individual substrates.

The individual elements are etched in concentrated nitric acid at a temperature of 50° C., in order to remove the silver profile band. A temperature sensor produced according to this embodiment has the following data, wherein the platinum thickness amounts to 2 µm:
R0=8.70 Ohm;
R25=9.54 Ohm;
R100=11.97 Ohm;
Tk=3754 ppm/K;
$R_\square$=0.054 Ohm (square resistance);
Conductor path breadth=20 µm;
Overall conductor path length L=3.5 mm.

Figure 6:
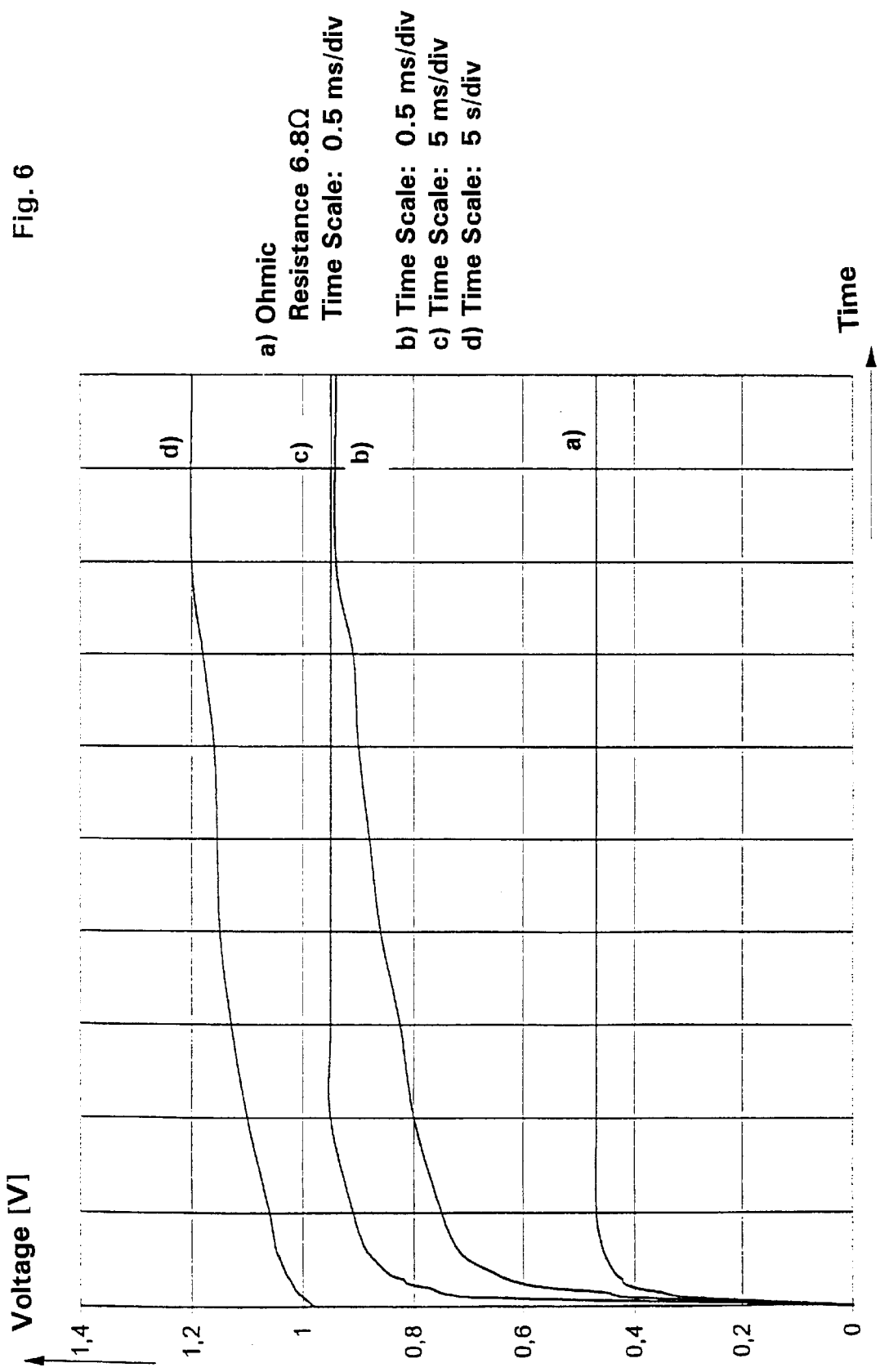
FIG. 6 shows the course over time of the rise in voltage (voltage U as a function of time t), wherein the sensor is acted upon by a current of 0.07 A. The time scale amounts to 0.5 ms/div or partition for curves (a) and (b), 5 ms/div for curve (c), and 5 s/div for curve (d)

In accordance with FIG. 6, the same structure for measuring is used as according to the first embodiment. The sensor here is acted upon by a current of 0.07 A. A rapid voltage rise to U=0.67 V is thereby observed on the sensor under consideration within 0.5 ms. As a consequence of the adjusted heating, the voltage $U_\infty$=1.2 V increases, which corresponds to a resistance of $R_\infty$=17.14 Ohm and a temperature $T_\infty$=279° C. The temperature jump of $\Delta T$=254° C. is reached within 5 ms (t 50%).

The measurement curves attained for this embodiment are represented in FIG. 6. At a pure ohmic resistance of 6.8 Ohm (measuring curve a; time scale: 0.5 ms/div), no further voltage rise and consequently no temperature rise is recognizable following a generator-conditioned build up time of about 0.5 ms. This behavior is fundamentally different with the platinum sensor in accordance with embodiment 2. The measuring resistance heats up in accordance with the shown temporal measurement curves b) (time scale: 0.5 ms/div), c) (time scale: 5 ms/div) and d) (time scale: 5 s/div) and reaches an equilibrium temperature of about 279° C.

Figure 7:
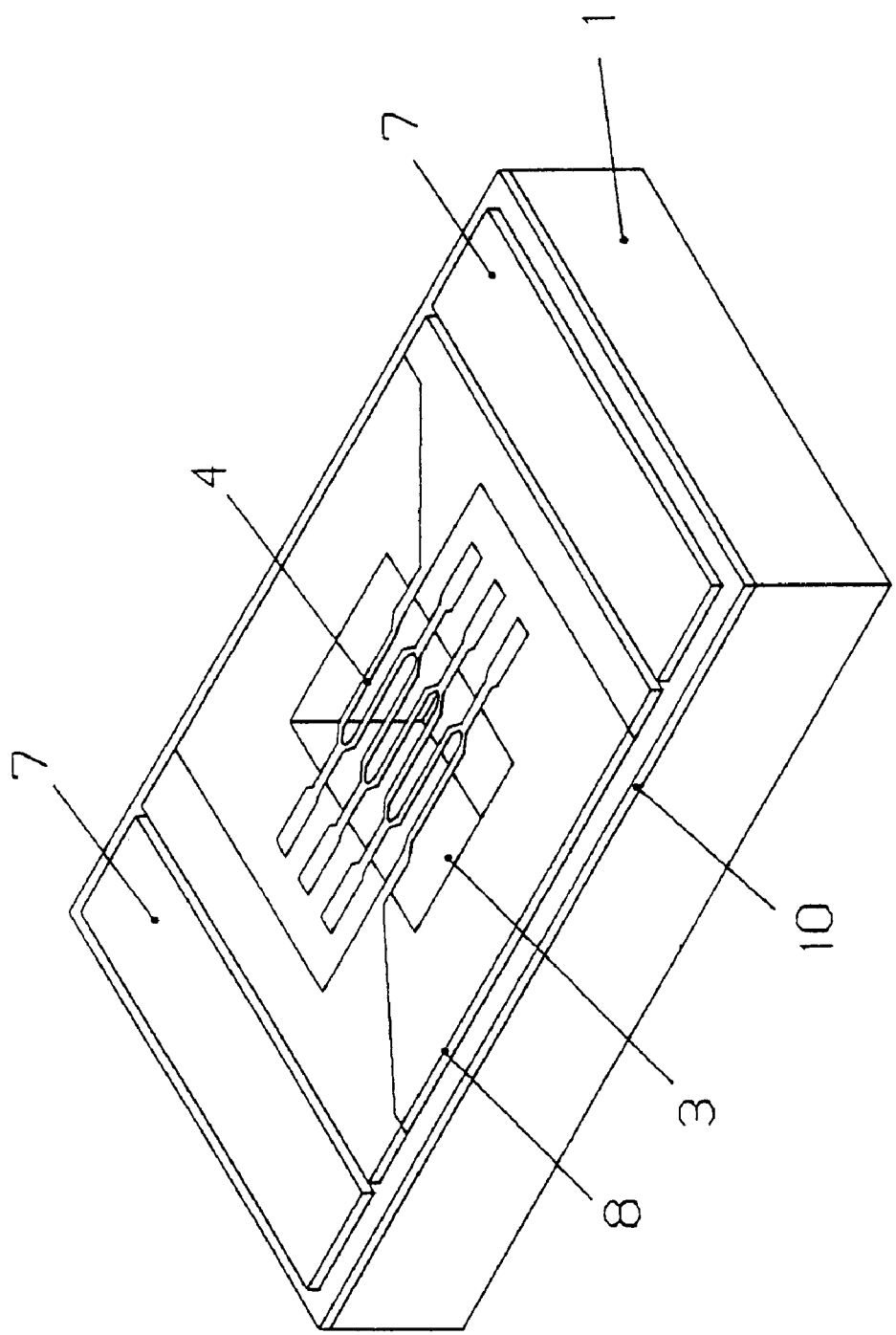
FIG. 7 shows a resistor in which the conductor path is applied as a meander of platinum or gold on a thin film membrane, and is passivated by a cover layer in the area of the recess.

In the embodiment in accordance with FIG. 7, the membrane 10 is applied by a PVD process at a thickness of 2 µm. In addition, a thin Pt electrode with a thickness of 0.05 µm was applied in the same PVD process. After the photostructuring process, the conductor paths were exposed. These were subsequently generated galvanically in an acid Pt electrolyte at a thickness of about 1.8 µm. After removal of the photoresist, the substrate was slit into the individual sensors in a diamond saw, and thereafter the indium filling in the square substrate recesses was removed in a wet chemical process. Now, a differential etching of the platinum of about 0.1 µm was conducted by an ion etching process, in order to separate the conductor paths electrically. After this, a tempering took place. Selectively, a second SiO layer of the same thickness was then applied as cover layer 8 by means of a PVD process. Then, a gold screen printing of the connection contact surfaces 7 took place.

Figure 8:
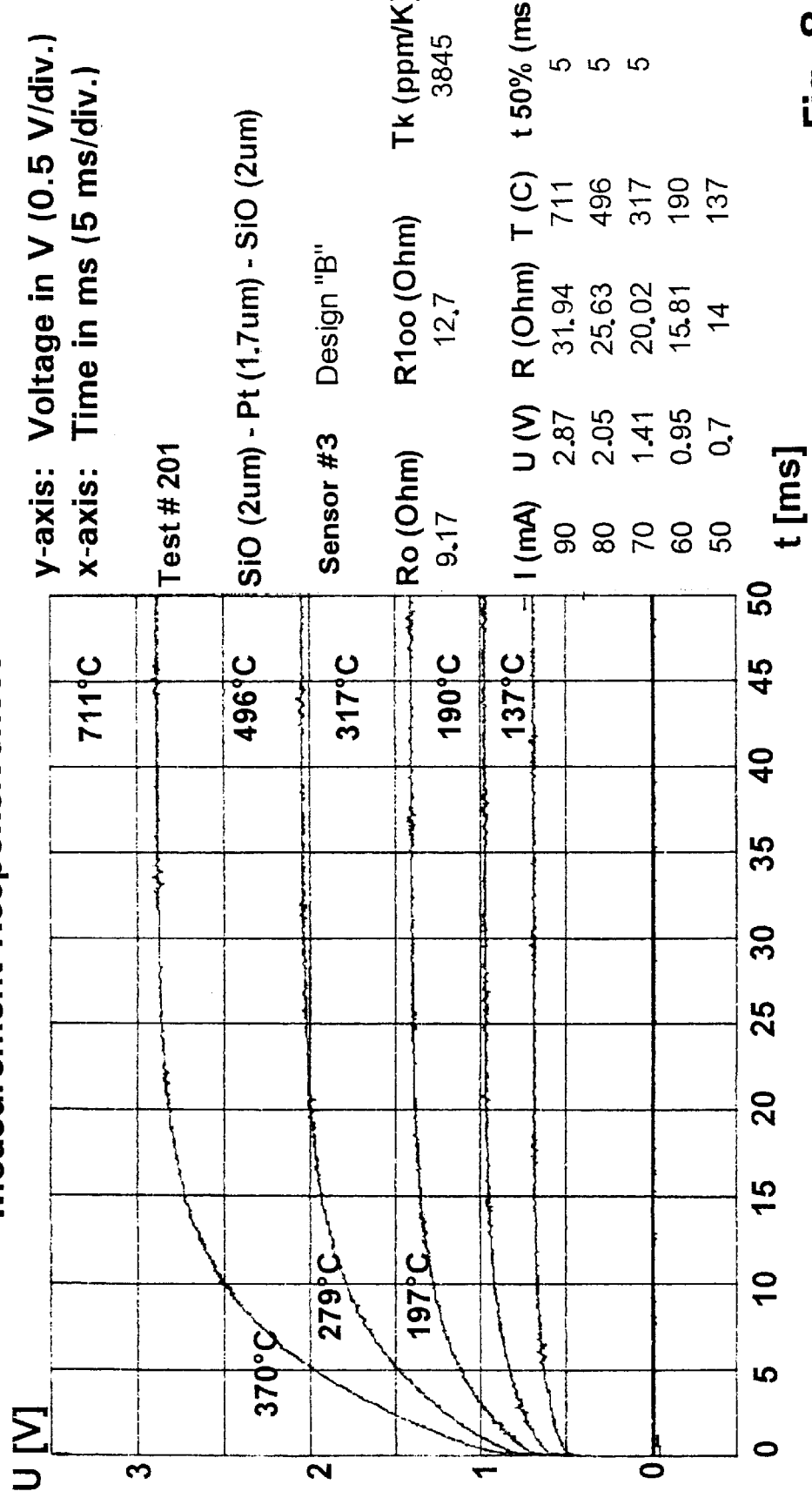
FIG. 8 shows a response time determination (voltage U as a function of time t) for a resistor with a conductor path as platinum meander of thickness 1.7 μm in accordance with FIG. 7.

In a dynamic test, such a resistor manifests a behavior as shown in FIG. 8. The values for this sensor amount to:
R0=9.17 Ohm;
R100=12.70 Ohm;
Temperature coefficient Tk=(R100−R0)/100·R0= 3849·10$^{-6}$K$^{-1}$).

With the indicated electric currents, the platinum meander was heated proceeding from room temperature to the temperatures indicated in FIG. 8.

The time to attain 50% of this temperature jump is likewise indicated in FIG. 8 and for such a resistance t(50%)=5 ms.

A twenty hour temperature change test was additionally conducted with this resistor. Here, the resistor was heated up electrically with a frequency of f=30 Hz during the 20 hours mentioned 2,160,00 times from room temperature to a temperature T=370° C. The resistor passed this test undamaged.

It will be appreciated by those skilled in the art that changes could be made to the embodiment(s) described above without departing from the broad inventive concept thereof. It is understood, therefore, that this invention is not limited to the particular embodiment(s) disclosed, but it is intended to cover modifications within the spirit and scope of the present invention as defined by the appended claims.

We claim:

1. A process for manufacturing a resistor, particularly a measuring resistance for a rapidly responding temperature sensor, having a conductor path provided with at least two connection contact fields which are arranged on an electrically insulating surface of a ceramic substrate, wherein a portion of the conductor path spans a recess in the substrate in a bridge-like manner and the conductor path is arranged in a plane and wherein the conductor path is fastened on the electrically insulating surface of the substrate in an edge area of the substrate adjacent to the recess, the process comprising creating a recess (3) in the substrate (1), filling the recess with a filler selected from the group consisting of glass pastes, glass ceramics, glass solder, silver, indium, nickel, and silver-nickel alloys, levelling the filling thus introduced with an outer surface of the substrate (1), applying the conductor path (4) to the substrate galvanically or in a thin film process as a platinum layer/Pt foil with a thickness in a range of 1 to 6 μm or of a gold layer with a thickness in a range of 1 to 8 μm, subsequently applying a structured cover layer (8) at least partially on the conductor path (4), and thereafter etching away the filler situated in the recess (3).

2. The process according to claim 1, wherein before applying the conductor path (4) to the substrate, an additional flat membrane (10) of a thickness in a range of 1 to 50 μm is applied to the surface of the substrate by a screen printing or thin film process.

3. The process according to claim 2, wherein the membrane (10) is applied to the surface of the substrate by a screen printing process as a glass membrane or in a thin film process as a thin film membrane of SiO.

4. The process according to claim 1, wherein the structured cover layer (8) is applied to the conductor path (4) by a screen printing process as glass or in a thin film process as a thin film layer of SiO.

5. The process according to claim 1, wherein the recess (3) is created at a depth range of 20% to 60% of the thickness of the substrate.

6. The process according to claim 1, wherein the recess (3) is cut out with a laser beam and includes the entire substrate thickness.

7. The process according to claim 1, wherein a glass paste is applied to the conductor path (4) and substrate (1) as a cover layer with approximately the same expansion coefficient as the substrate (1), and these are fired at a temperature in a range of 500° C. to 1000° C. in a continuous heating furnace during a period of about 20 minutes.

8. The process according to claim 1, wherein as filler material a profile wire is used selected from the group consisting of silver, nickel and alloys thereof.

9. The process according to claim 1, wherein the conductor path (4) is applied in a thin layer process and structured by photolithography, ion etching and removal of photoresist.

10. The process according to claim 1, wherein the conductor path (4) is galvanically deposited in a resist channel on a previously applied metal electrode, and the metal electrode is subsequently removed chemically or by a dry etching process.

11. The process according to claim 1, wherein the conductor path (4) is deposited by a PVD process in a photolithographically generated resist channel, and the photoresist is subsequently removed.

* * * * *